United States Patent [19]

Matsumoto et al.

[11] Patent Number: 4,886,951
[45] Date of Patent: Dec. 12, 1989

[54] POWER SUPPLY FOR A MAGNETRON HAVING A RECTIFYING CIRCUIT, SWITCHING CIRCUIT, AND TRANSFORMER

[75] Inventors: Takahiro Matsumoto, Nara; Haruo Suenaga, Kyoto; Naoyoshi Maehara, Nara; Kazuho Sakamoto, Kyoto; Takashi Niwa, Nara; Daisuke Bessyo, Yamatokoriyama; Shigeru Kusunoki, Yamatokoriyama; Takao Shitaya, Yamatokoriyama, all of Japan

[73] Assignee: Matsushita Electric Industrial Co., Ltd., Osaka, Japan

[21] Appl. No.: 189,170

[22] Filed: May 2, 1988

[30] Foreign Application Priority Data

Apr. 30, 1987 [JP] Japan ................................ 62-106636
Apr. 30, 1987 [JP] Japan ................................ 62-106637

[51] Int. Cl.$^4$ .............................................. H05B 6/68
[52] U.S. Cl. ........................ 219/10.55 B; 219/10.55 R; 363/21; 315/106; 336/182
[58] Field of Search ............... 219/10.55 B, 10.55 R; 363/20, 21; 323/362, 358, 359; 315/106, 105, 107; 328/267, 270; 331/86, 87, 186; 336/180, 182, 183

[56] References Cited

U.S. PATENT DOCUMENTS

| | | | |
|---|---|---|---|
| 3,973,165 | 8/1976 | Hester | 315/105 |
| 4,076,996 | 2/1978 | Maehara et al. | 315/106 |
| 4,318,165 | 3/1982 | Kornrumpf et al. | 363/21 |
| 4,620,078 | 10/1986 | Smith | 219/10.55 B |
| 4,631,511 | 12/1986 | Sylvester et al. | 336/180 |
| 4,704,674 | 11/1987 | Maehara et al. | 219/10.55 B X |

*Primary Examiner*—Philip Leung
*Attorney, Agent, or Firm*—Wenderoth, Lind & Ponack

[57] ABSTRACT

A power supply for a magnetron includes a rectifying circuit, a switching circuit, and a transformer. The rectifying circuit converts an ac-power source signal into a dc-power source signal. The switching circuit converts the dc-power source signal output from the rectifying circuit into a high-frequency signal in accordance with a driving circuit. A transformer connected to the switching circuit converts the high-frequency signal into a high-voltage high-frequency signal for driving the magnetron. The transformer includes a primary winding connected to the switching circuit, a secondary winding connected to the magnetron, a tertiary winding connected to a cathode heater of said magnetron, and a fourth winding connected to the driving circuit. The coupling coefficient between the fourth winding and the second winding is larger than the coupling coefficient between the fourth winding and the primary winding.

14 Claims, 10 Drawing Sheets

POWER SUPPLY FOR A MAGNETRON HAVING A RECTIFYING CIRCUIT, SWITCHING CIRCUIT, AND TRANSFORMER

BACKGROUND OF THE INVENTION

The present invention generally relates to a power supply for a magnetron, wherein a high-voltage power-supply to be applied to the magnetron is adapted to be provided by an inverter circuit.

Generally, various types of magnetron power supplies, each having an inverter circuit, are used. The description herein will be given with regard to a power supply for a magnetron for use in a high-frequency heating apparatus.

FIG. 1 is a circuit diagram of a magnetron power supply for a conventional high-frequency heating apparatus. A commercial power-supply 1 is rectified by a diode bridge 2 to provide a dc power supply 3. The output of the dc power supply 3 is converted into high frequencies by an inverter circuit 5 having a switching element 4, is boosted and rectified by a high-voltage transformer 6, and thereafter is applied to a magnetron 7. A power controlling system of this high-frequency heating apparatus uses an input current controlling system for controlling the input current $I_{in}$ from the commercial power supply 1 so that it may become a given value. Namely, an inverter controlling circuit 9 receives a signal from an input current detecting portion 8 to adjust the input current $I_{in}$ to a given value. (The construction time ratio of the switching element 4 is adjusted.)

The current flows only to the heater portion, but does not flow between the anode and the cathode before the magnetron 7 starts its oscillation when its cathode temperature sufficiently rises to a desired temperature. When the input current $I_{in}$ is controlled to the oscillating operation of the magnetron, excessive voltage is caused between the anode and the cathode to deteriorate the withstand voltage. Also, an inconvenience arises in that the service life of the magnetron 7 becomes shorter due to the excessive current flowing into the heater. Accordingly, at first the input current adapted to be controlled at a value smaller than a given value. A control portion 9 has a time controlling mechanism for switching the input current to a steady-state value after the time lapse is sufficient enough to start the oscillation so as to settle the problem.

The time necessary to start the oscillation is 4 seconds when the magnetron is kept cold, and 2 seconds when it is kept warm. In a case like this, in the input current controlling system using the time control mechanism, the time for limiting the input current to a small value is required to be set at approximately 5 seconds, or any such time longer than the maximum time (4 seconds) necessary to start the oscillation.

When it is set like this, the time is required to control the input current at a small value without fail for 5 seconds even when the magnetron is kept warm. Accordingly, in the conventional high-frequency heating apparatus using such a control system as described hereinabove, this time difference (5−2=3 seconds) requires the period for controlling at the smaller input current although the controlling operation may be effected to the given input current, thus resulting in the wasteful time in the operation of the high-speed cooking apparatus.

FIG. 2 shows a timing chart of the input current $I_{in}$ before the oscillation start of the the magnetron, magnetron output Po, and the voltage $V_{AK}$ between the anode and the cathode. In the periods a and b, the value is restricted to a smaller one in the input current $I_{in}$, with the given output Po from the magnetron not being caused, and in the period c, the output of the magnetron becomes the given value. The time necessary for the magnetron to start its oscillation is only the period of time period a. The period of time period a may almost be zero, but even in the time period b, the current is limited, with this period also being wasted.

In order to shorten the wasteful time, there is a method of feeding heating power by a heater transformer which is separate from the high-voltage transformer 6 to pre-heat the cathode of the magnetron 7 in advance. However, the apparatus becomes larger in size and higher in cost.

Accordingly, it is extremely difficult to shorten the rising time of the cathode temperature when the cathode of the magnetron is cold, with a restriction being caused in the reduction of the wasteful time in the conventional construction.

During the time period b portion of the wasteful time, the input current is so restricted that the power is not sufficiently fed to the heater of the magnetron. Thus, the magnetron is oscillating with the cathode temperature being lower than the desired temperature. The emission of the cathode is likely to be short, so that the oscillation becomes unstable enough to cause so-called emission modulating.

Accordingly, the disadvantage is so serious that the life service of the magnetron may be shortened.

SUMMARY OF THE INVENTION

Accordingly, an essential object of the present invention is to provide a power supply for a magnetron, which is capable of removing wasteful time at the starting operation through the detection of the oscillation start of the magnetron.

Another important object of the present invention is to provide a power supply for a magnetron, which is capable of preventing the magnetron from being deteriorated due to the modulating.

In accomplishing these and other objects, according to one preferred embodiment of the present invention, there is a power supply for a magnetron which includes a dc power supply, at least one switching element which converts the output of the dc power supply into a high frequency power signal and an inverter circuit having the driving circuit, a magnetron which emits high frequencies to heat foods, fluids and so on, a transformer which boosts the output of the inverter circuit to feed the power to the magnetron, and which is characterized in that the transformer is composed of primary winding connected with the inverter circuit, secondary a winding for feeding the high-voltage high-frequency power to the magnetron, a tertiary winding for feeding the low-tension low-voltage high-frequency power to the cathode heater of the magnetron, a fourth winding for providing voltage signals to the driving circuit, wherein the coupling coefficient K24 between the fourth winding and the secondary winding is larger than the coupling coefficient K14 between the fourth winding and the primary winding. In this construction, in a time period before the magnetron starts its oscillation, a high voltage is caused in the secondary winding. However, the coupling between the fourth winding and the secondary winding is adapted to be higher than the coupling between the fourth winding and the primary winding, so that a detection voltage signal is caused which is stronger in correlation to the higher voltage to be caused in the primary winding, and thus is proportional to the higher voltage of the secondary winding. As the oscillation start time of the magnetron is detected by the output signal of the fourth winding, the driving circuit may be constructed so that the inverter circuit may be switched in operation before the oscillation start of the magnetron and after the oscillation. Namely, at the starting operation, the operative frequency of the inverter is controlled so that the output voltage of the secondary winding may not be excessive as compared with the given value. The operative frequency is controlled so that the given electromagnetic waves may be outputted after the oscillation of the magnetron. Accordingly, a controlling operation may be effected so that the electromagnetic wave output of the magnetron in the shortest time of the respective conditions may reach the given value regardless of whether the cathode temperature is high or low of the magnetron at the starting time. Namely, when the cathode temperature reaches the desired temperature in spite of the initial temperature of the cathode of the magnetron, the electromagnetic wave output becomes a rated value, so that the wasteful time in the conventional system may be prevented. Also, as the excessive voltage of the magnetron, the application of the excessive current during this period may be completely prevented. Therefore, the shorter service life may be prevented, and a higher reliability may be realized.

BRIEF DESCRIPTION OF THE DRAWINGS

These and other objects and features of the present invention will become clear from the following description taken in conjunction with the preferred embodiments thereof with reference to the accompanying drawings, in which.

DETAILED DESCRIPTION OF THE INVENTION

Figure 1:
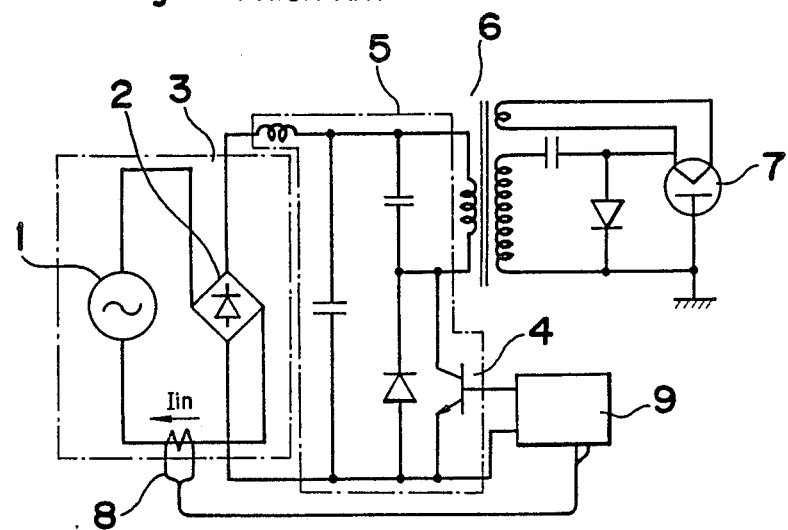
FIG. 1 is a circuit diagram of a power supply for a magnetron in the conventional embodiment.
Figure 2:
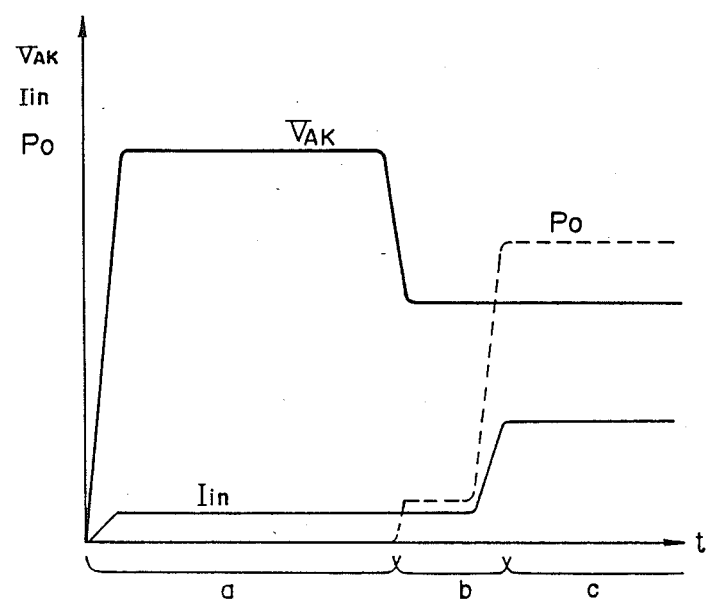
FIG. 2 is a timing chart at the magnetron oscillation start in the conventional embodiment.

Before the description of the present invention proceeds, it is to be noted that like parts are designated by like reference numerals throughout the accompanying drawings.

Figure 3:
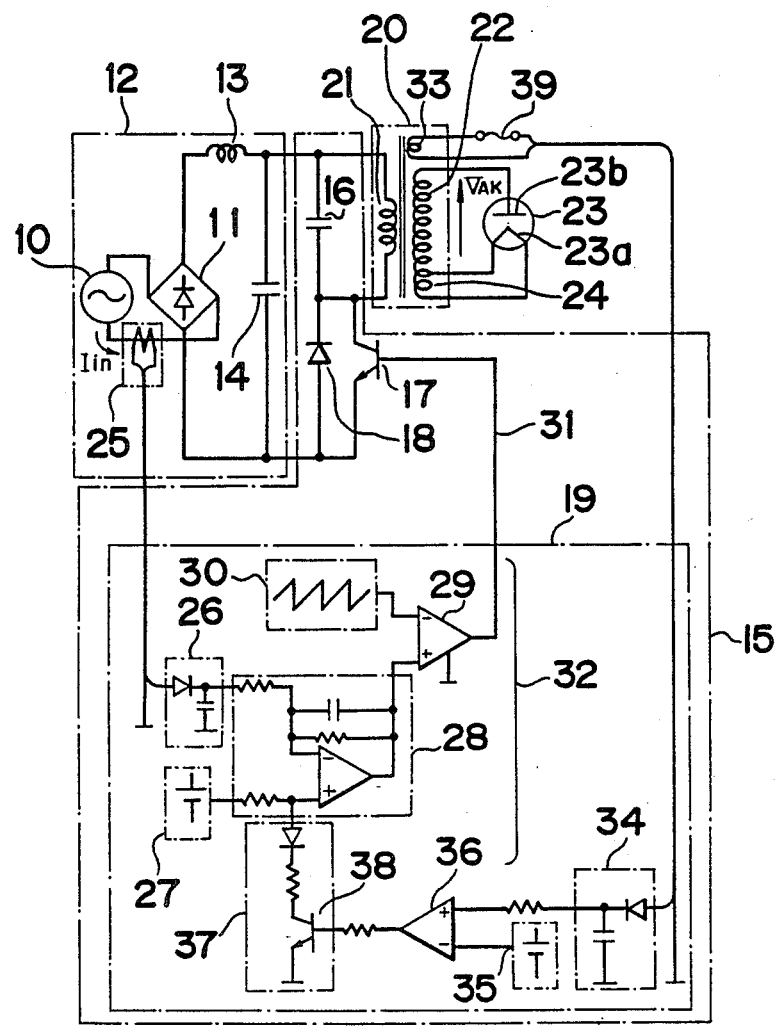
FIG. 3 is a power-supply circuit diagram of a magnetron power supply in accordance with the present invention.

Referring now to the drawings, there is shown in FIG. 3, a circuit block diagram of a high-voltage power supply generating portion for a high-frequency heating apparatus according to one preferred embodiment of the present invention. Referring to FIG. 3, the power from the commercial power supply 10 is rectified by a diode bridge 11, with a dc power supply 12 being formed. An inductor 13, a capacitor 14 serve as filters with respect to the high-frequency switching operation of an inverter circuit 15.

The inverter circuit 15 is composed of a resonance capacitor 16, a power transistor 17 used for switching, a diode 18 and a driving circuit 19. A power transistor 17 is switched at a given period and a duty ratio (namely, on/off time ratio) according to a base current to be fed from the driving circuit 19. The high-frequency power thus caused is fed to the primary winding 21 of the transformer 20 so as to be expressed as high-voltage high-tension output to the secondary winding 22, which is fed between the cathode 23a of the magnetron 23 and the anode 23b. The low-voltage high-frequency power is caused in the tertiary winding 24 of the transformer 20 to heat the cathode 23a of the magnetron 23 to operate the magnetron 23.

The input current detector 25 detects an input current $I_{in}$ from the commercial power supply 10. The difference between a current reference signal 27 and a signal obtained by rectification of the output through the input current signal rectifying circuit 26 is amplified by a current error amplifying circuit 28, so that it is inputted into a comparator 29. The comparator 29 forms the on/off pulse for the power transistor 17 as an output signal 31 according to the input signal and the saw-tooth wave from the saw-tooth wave generating circuit 30. The input current controlling portion 32 is composed of the elements comprising input current detector 25 through the comparator 29. The output of the current error amplification circuit 28 is increased as the input current $I_{in}$ is decreased, with the on time of the output signal 31 of the comparator 29 being longer so that the operation is effected in such a direction as to increase the input current $I_{in}$. Inversely, when the input current $I_{in}$ increases, an operation is effected to reduce the input current. In this manner, the input current controlling portion 32 controls the input current $I_{in}$ so that it may become a given value.

Also, as the fourth winding 33 provided on the transformer 20 has the connection with the secondary winding 22 raised, the voltage $V_{AK}$ is detected. The signal provided through rectification of the output by the output voltage signal rectification 34 is compared with a voltage reference signal 35 by a comparator 36. The output logic is inputted into a current reference signal switching circuit portion 37 to switch the current reference signal 27 in accordance with the voltage $V_{AK}$. Namely, as the voltage $V_{AK}$ becomes higher with little input current $I_{in}$ before the magnetron 23 starts its oscillation, the current reference signal 27 is controlled low so as to set the voltage reference signal 35 to switch the current reference signal 27 by a transistor 38 so that the input current $I_{in}$ may increase when the voltage $V_{AK}$ has been lowered because of the oscillation of the start of magnetron 23. In other words, the oscillation of the start of magnetron 23 is detected by the output voltage drop of the fourth winding 33 so as to match the input current $I_{in}$ to rating. Fuse 39 is provided to prevent smoking when the fourth winding 33 has been short-circuited.

Figure 4:
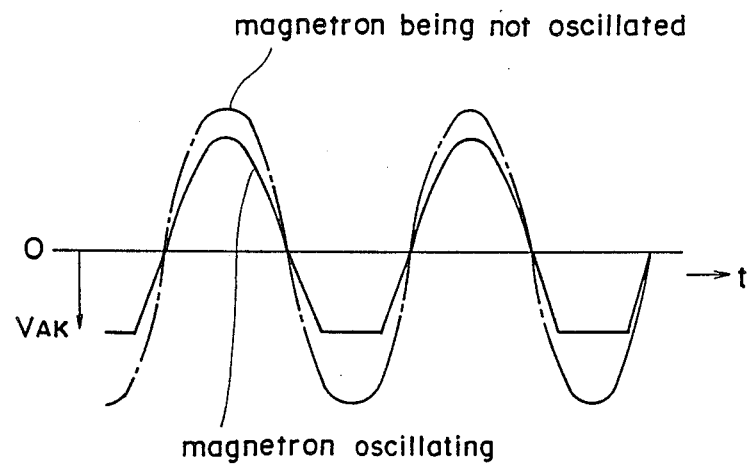
FIG. 4 is a secondary winding voltage waveform chart of a transformer of a magnetron power supply.

FIG. 4 shows the high-voltage power supply $V_{AK}$ voltage waveform when the magnetron 23 has been oscillated and when the magnetron 23 has not oscillated, with the difference therebetween being apparent. The voltage in the negative direction is one in the sequential direction of oscillating the magnetron 23. Such an operation principle diagram as shown in FIG. 5 shows the relationship with respect to the input current $I_{in}$ with the voltage being defined as $V_{AK}$.

Figure 5:
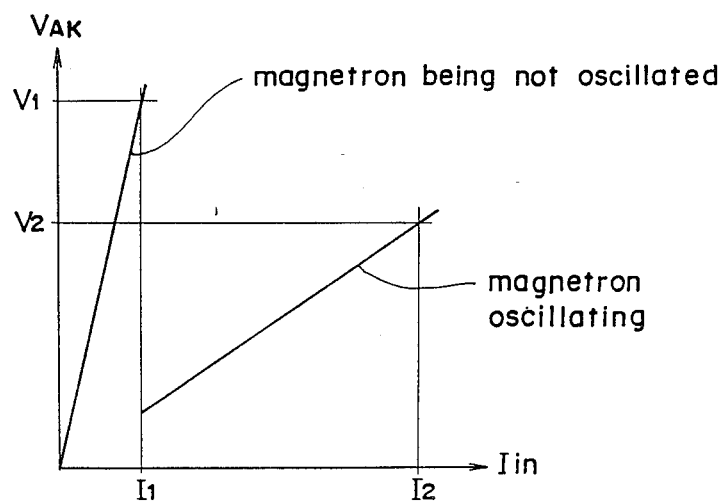
FIG. 5 is a characteristic chart of input current in the oscillation, non-oscillation of the magnetron of the magnetron power supply, the voltage between the anode, cathode.

Referring to FIG. 5, reference character V1 is a permissible applied voltage of the magnetron 23, reference character I1 is an input current $I_{in}$ from the commercial power-supply 10 when the voltage $V_{AK}$ is equal to V1 with the magnetron not being oscillated. Reference character V2 is a high-tension voltage $V_{AK}$ at the rated output of the magnetron 23 and an input current $I_{in}$ at this time. The input current I1, when the magnetron 23 is not oscillated, is less than I2, while the output voltage V2, when it is oscillated, is smaller than the voltage V1.

Accordingly, in FIG. 3, an input current detector 25 detects the input current $I_{in}$ to set the rectifying direction of the output voltage signal rectifying circuit 34 so that a voltage signal equivalent to the voltage $V_{AK}$ may be detected by the fourth winding 33, the current level I1 may be set at the activation of the transformer 38 of a current reference signal switching circuit portion 37, the current level I2 may be set at the deactivation thereof. When a voltage reference signal 35 is set so as to correspond between the voltage V1 and the voltage V2, the input current is controlled at the current level I1 before the magnetron 32 starts its oscillation, and at the I2 when the current level oscillation is started.

As the voltage reference signal 35 is set to be switched at a place where the signal becomes smaller than V1, and larger than V2, to effect such a controlling operation as described hereinabove, it is indispensable to establish that V1>V2. Furthermore, it is possible to detect the oscillation of the magnetron 23 more easily if the ratio V1/V2 is larger. The voltage signal to be expressed in the secondary winding 22 is not completely similar to each other, but it is possible to retain the relationship of V1>V2 if the coupling coefficient K24 of the secondary winding 22 and the fourth winding 33 is made larger, and the coupling coefficient K14 of the primary winding 21 and the fourth winding 33 is made smaller. Table 1 shows the value of V1/V2 when the K24 and K14 have been changed.

TABLE 1

| K24 | K14 | V1/V2 |
| --- | --- | --- |
| 0.704 | 0.494 | 1.75 |
| 0.531 | 0.412 | 1.08 |
| 0.451 | 0.384 | 1.01 |
| 0.372 | 0.386 | 0.55 |
| 0.524 | 0.532 | 0.34 |

Figure 6:
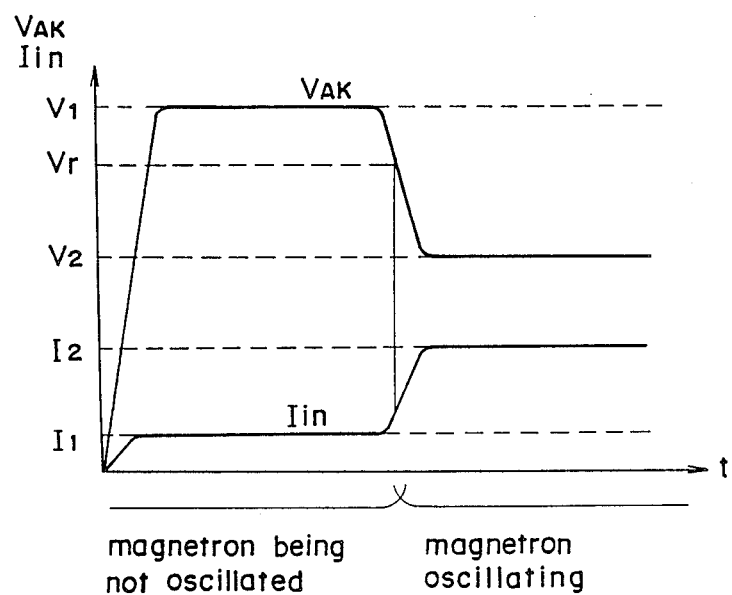
FIG. 6 is a timing chart at the magnetron oscillation start of the power supply.

FIG. 6 is a starting characteristic graph showing the variation in the value of $V_{AK}$ and $I_{in}$ from the start of operation of the circuit of FIG. 3. When the magnetron starts its oscillation, $V_{AK}$ is lowered. The controlling operation is effected so that the setting value of $I_{in}$ may be switched from I1 to I2.

In FIG. 3, the transformer is activated upon detection of the input current. A method of detecting the current by the voltage drop through the insertion of the resistor into the system may be varied. Also, the input current controlling portion 32 may not be limited to the circuit construction shown.

Also, even when a voltage doubler rectifying circuit has been provided between the high-voltage transformer 20 and the magnetron 23, a similar method may be adapted.

In the above-described construction, the input current $I_{in}$ is changed so that the rated output may be automatically obtained when the magnetron starts its oscillation whether the magnetron is kept cold or warm, so that the wasteful time as in the conventional example is not caused, and furthermore the application of the excessive voltage upon the magnetron may be prevented. Accordingly, a magnetron power supply for the high-frequency heating apparatus which is higher in reliability may be realized.

Figure 7:
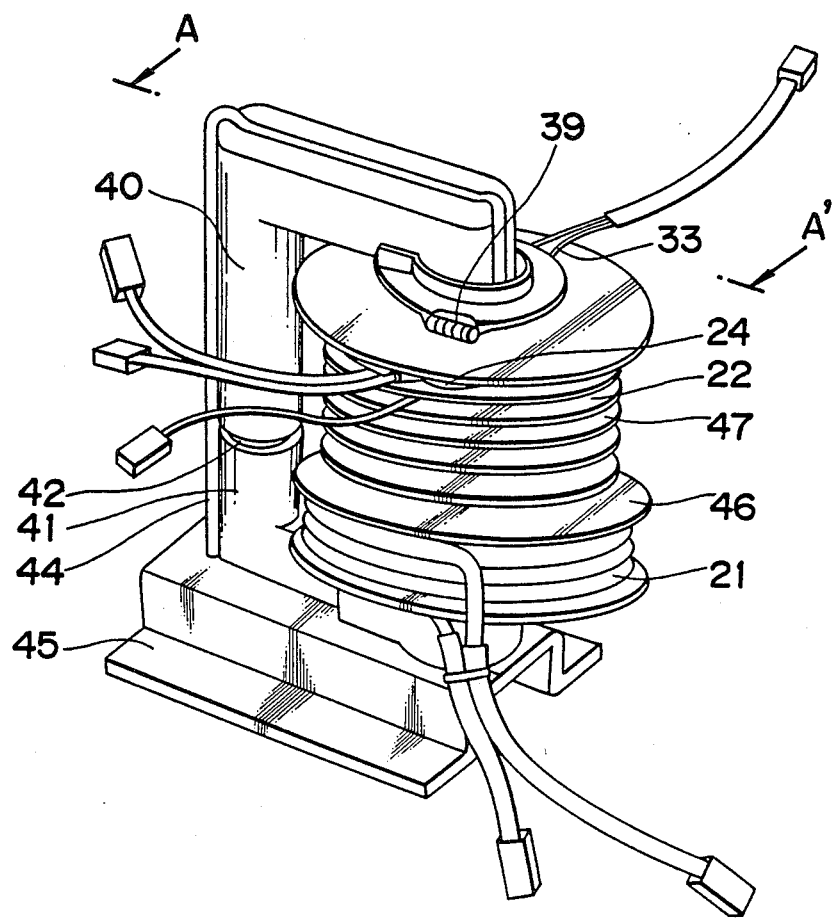
FIG. 7 is a perspective view in one embodiment of the transformer of the power supply.
Figure 8:
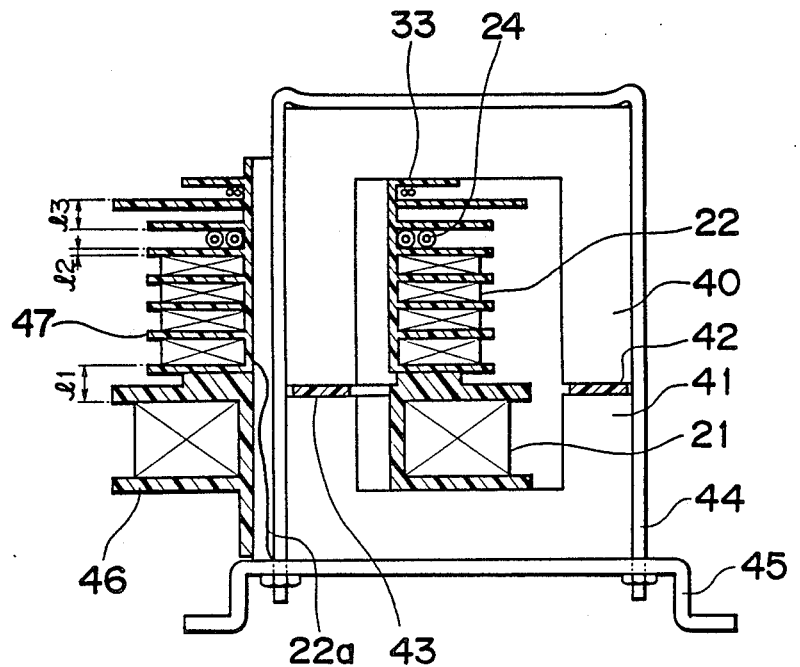
FIG. 8 is a cross-sectional view of the transformer.

FIG. 7 is a perspective diagram of a magnetron power supply of the present invention. FIG. 8 is a cross-sectional view in one embodiment of FIG. 7 taken along a line A—A'. In FIG. 7 and FIG. 8, the same reference characters are given to the components which are the same as those in FIG. 3. The VR type of cores 40, 41 of the transformer are composed of a ferrite material and having a low high-frequency loss, with gap spacers 42, 43 being grasped between the cores to constitute a magnetic path. The cores 40, 41 are secured with a fixture 44, and a stand 45. The respective windings 21, 22, 24, 33 are wound around a primary bobbin 46 and a secondary bobbin 47 integral with a gap spacer 43 made of resin material, with sufficient space l1 being provided between the primary winding 21 and the secondary winding 22. In the general high-frequency heating apparatus, the anode of the magnetron and the casing are at the same potential. When the primary winding and the secondary winding have been short-circuited, it is extremely dangerous to have high voltage applied in the casing. In order to prevent this danger, the space l1 between the primary winding 21 and the secondary winding 22 is made sufficiently larger than the space l2 between the secondary winding 22 and the tertiary winding 24. For a similar reason, the space l3 between the tertiary winding 24 and the fourth winding 33 is made sufficiently larger. As described hereinabove, the relationship between the coupling coefficient K14 of the primary winding 21, the fourth winding 33 and the coupling coefficient K24 between the primary winding 22 and the fourth winding 33 is K14<K24, the windings are positioned so that the tertiary winding 24, the secondary winding 22, the primary winding 21 are arranged in order from near the fourth winding 33 as shown in FIG. 8. As the coupling coefficient generally becomes higher if the space between the winding nears, K14<K24 is naturally established in the above-described arrangement, because the secondary winding 22 is closer to the fourth winding 33 than the primary winding 21 is. As the position of the gap spacer 43 is located between the primary winding 21 and the secondary winding 22, a gap which functions to leak the magnetic path to make the coupling coefficient smaller exists between fourth winding 33 and the primary winding 21, but not between the fourth winding 33 and the secondary winding 22, with the relationship of K14<K24 becoming obvious.

The primary winding 21 becomes substantially smaller in the conductor sectional-area and loss is increased due to the skin effect through the high frequency. In order to prevent the loss, so-called litz wires, which are composed of insulated stranded fine wires, are used. The primary winding lead is provided with a protective tube to maintain the insulation. The secondary winding 22 is wounded in four split so that the withstand voltage of the secondary winding 22 and the reactive current is controlled to reduce the heating. The low-pressure side lead 22a of the secondary winding 22 is connected with the transformer stand 45 and the cores 40, 41 at the same potential, with the potential of the cores being stabilized, thus resulting in high reliability.

As the tertiary winding 24 and the fourth winding 33 are both reduced in the number of the windings, the covered wires are used to protect, insulate the outgoing lead wires, with high-voltage silicone covered wires, vinyl chloride covered wires being used.

Figure 9:
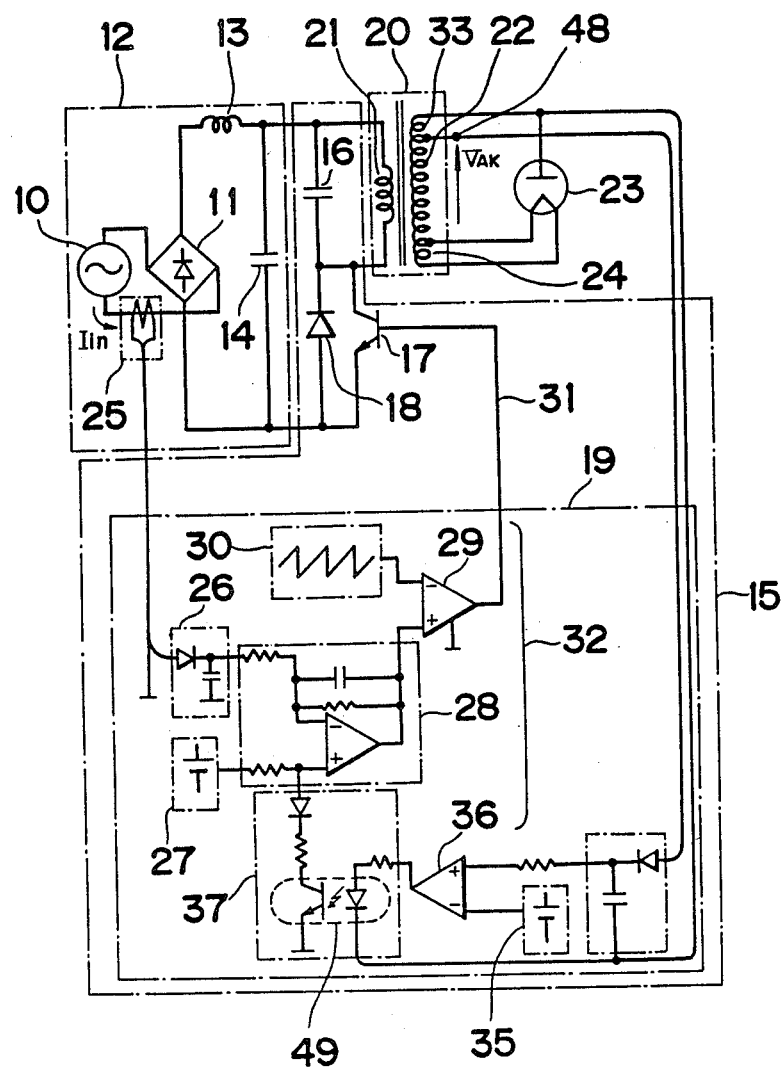
FIG. 9 is a power-supply circuit diagram of the magnetron power supply in the other embodiment.

FIG. 9 shows another embodiment of the present invention, wherein the fourth winding 33 is constructed with an intermediate terminal 48 being provided on the secondary winding 22. The same reference numerals are given to the same components as those of FIG. 3.

In FIG. 9, as the fourth winding 33 provided on the transformer 20 is constructed with the intermediate terminal 48 being provided on the secondary winding, the value is proportional to the secondary winding voltage $V_{AK}$. Namely, the voltage variation of $V_{AK}$ appears as a voltage signal divided across both ends of the fourth winding 33. The voltage reference signal 35 which is provided by the rectification of the voltage signal through the output voltage signal rectification circuit 34 is compared with the voltage reference signal 35 by a comparator 36. The output logic is inputted into a photo-coupler 49 of the current reference signal switching circuit portion 37 to switch the current reference signal. As the primary side of the transformer 20 is different in potential from the secondary side, it is required to give and take the signal by the photo-coupler 49. The start of oscillation of the magnetron 23 is detected in this manner to perform the current controlling operation to remove the wasteful time. When the fourth winding 33 has been constructed with the top in the secondary winding 22, the connection K24 between the secondary winding 22 and the fourth winding 33 becomes larger. Also, as the fourth winding is brought to the potential of the secondary winding, the insulation therebetween is unnecessary, so that the construction of the winding becomes easier to make.

Figure 10:
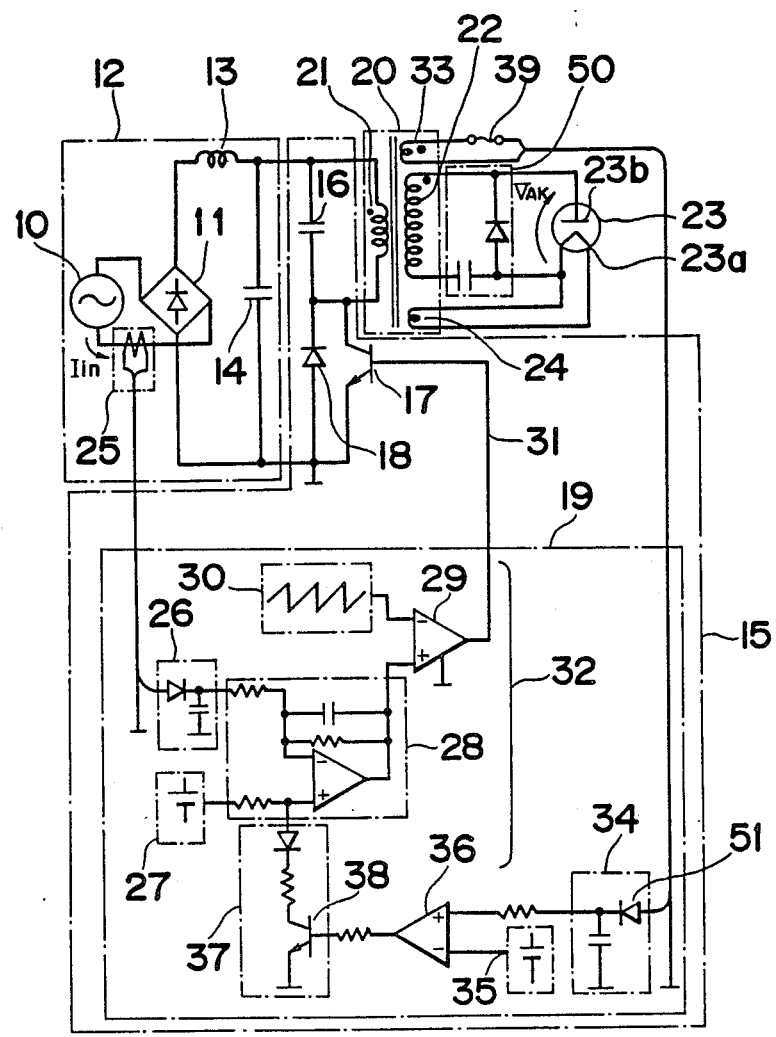
FIG. 10 is a power-supply circuit diagram of the magnetron power supply in the embodiment of the present invention, using half-wave voltage doubler in the high voltage.

FIG. 10 is an embodiment of the circuit construction with a voltage doubler rectification circuit 50 being provided under the high voltage. The same reference characters are given to the same components as those of FIG. 3.

Figure 11:
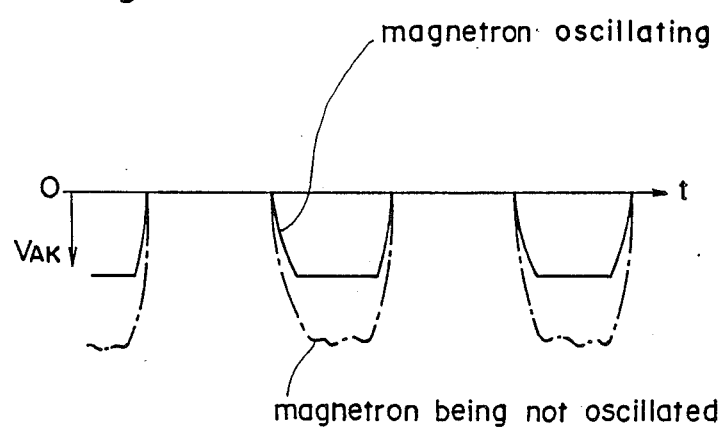
FIG. 11 is a voltage waveform chart between the anode and the cathode of the magnetron in the circuit of FIG. 10.

In the circuit of FIG. 10, the voltage between the cathode 23a of the magnetron 23 and the anode 23b thereof becomes wave-shaped as shown in FIG. 11. When the magnetron 23 is not oscillated as in a case where the voltage doubler rectification circuit shown in FIG. 4 is not used, the voltage becomes lower than when it is oscillated, so that the oscillating condition of the magnetron may be detected. When a half-wave rectification circuit is provided as shown in the output voltage signal rectification circuit 34 in the case of the circuit of FIG. 10, the connection is performed in consideration of the polarity of the fourth winding so that the diode 51 used for half-wave rectification use of the output voltage signal rectification circuit 34 may be conducted when the voltage of $V_{AK}$ has been caused. When a two-wave rectification circuit has been used for the output voltage signal rectification circuit 34, the same effect may be provided without any consideration of the polarity. In this circuit construction where the secondary winding output of the transformer 20 is applied upon the magnetron 23 through the voltage doubler rectification, the wasteful time at the oscillation start of the magntron is removed, and further the boosting ratio at the transformer, i.e., the primary, secondary ratio may be approximately one half in order to boost twice as many as the voltage on the secondary side of the transformer by the voltage doubler rectification circuit 50. In other words, there is an effect in that the winding of the secondary winding 21 may be half-waved.

Figure 12:
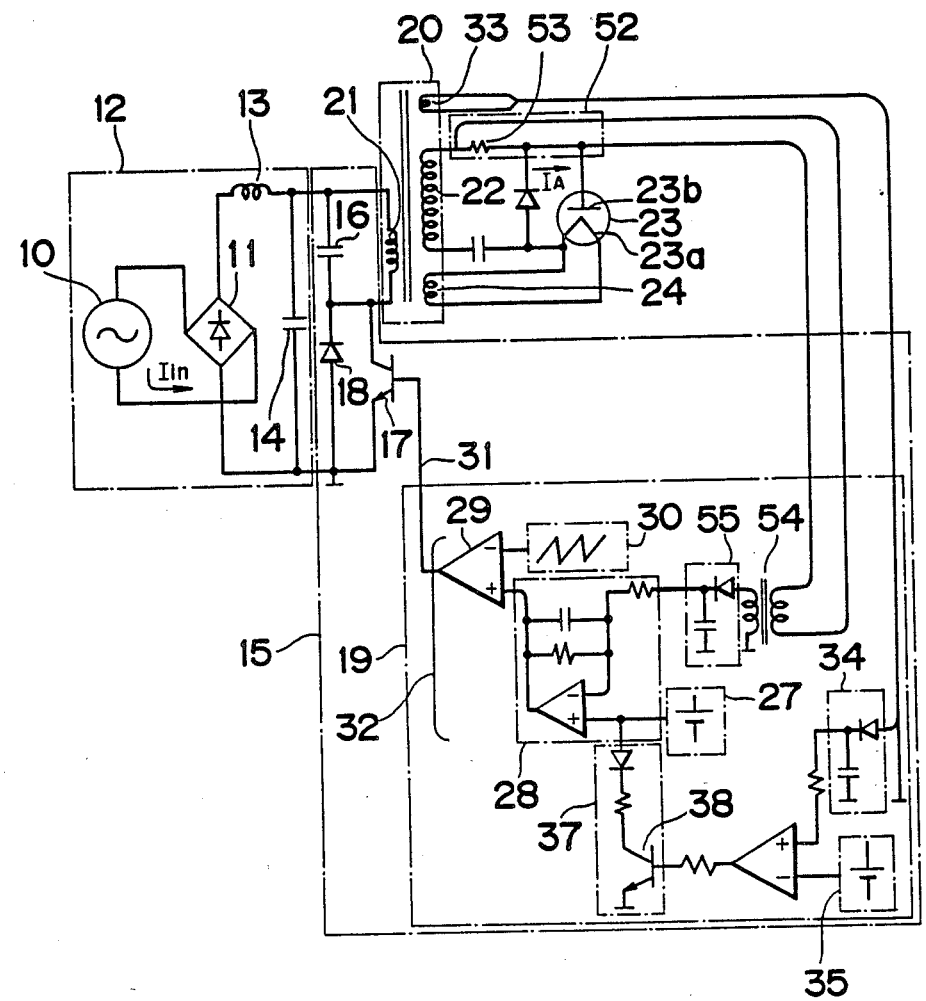
FIG. 12 is a circuit diagram of the magnetron power supply in the embodiment of the present invention for effecting the secondary current feedback control.

FIG. 12 shows an embodiment of the present invention using a circuit which feedbacks the current of the secondary side of the transformer to control it so as to stabilize the output of the apparatus. The same reference is given to the components which are same as those in FIG. 3.

In the circuit of FIG. 12, the input current $I_{in}$ and the anode current IA are interrelated to each other and are approximately proportional. Also, the anode current IA and the secondary current Is of the transformer are approximately proportional. Accordingly, the equal input and output controls may be effected even if the secondary current Is of the transformer, instead of the input current $I_{in}$, is detected. The secondary current detecting portion 52 rectifies the voltage to be caused across both ends of the resistor through the insulation transformer 54 by the secondary current signal rectification circuit 55 when the current has flowed to the secondary current detection resistor 53 so as to compare it with the current reference signal 27 to control the on, off ratio of the transistor 17. The circuit of FIG. 12 is equivalent to the circuit construction of FIG. 3 except that the power is controlled by the secondary current Is which is approximately proportional to it, instead of the input current $I_{in}$. It is desired so that the magnetron power supply should be controlled so as to be stabilized in output more than in input. Accordingly, the controlling operation of the power by the secondary current Is, instead of the power controlling by the input current $I_{in}$, has an effect that the stabler power control may be effected by a portion closer the output. It is needless to say that means for the controlling operation by the anode current IA of the magnetron has the same effect.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A magnetron power supply comprising: a magnetron having a cathode heater;
   a rectifying means for converting an ac-power source signal into a dc-power source signal;

a switching means coupled to a driving circuit and said rectifying means for converting said dc-power source signal into a low-voltage high-frequency signal in accordance with said driving circuit; and, a transformer having a core, said transformer coupled to said switching means and said driving circuit, for converting said low-voltage high-frequency signal into a high-voltage high-frequency signal for driving said magnetron;

said transformer including a primary winding connected to said switching means, a secondary winding connected to and supplying power to said magnetron, a tertiary winding connected to said cathode heater of said magnetron for providing heating power to said cathode heater, and a fourth winding connected to and supplying signals to said driving circuit;

wherein a coupling coefficient between said fourth winding and said secondary winding is larger than a coupling coefficient between said fourth winding and said primary winding.

2. A magnetron power supply as recited in claim 1 wherein said secondary winding is provided between said fourth winding and said primary winding.

3. A magnetron power supply as recited in claim 1 or claim 2, wherein said fourth winding comprises a winding of film wire.

4. A magnetron power supply as recited in claim 1, further comprising a fuse provided between said driving circuit and said fourth winding to open said connection therebetween when a current exceeding a given value flows through said fuse.

5. A magnetron power supply as recited in claim 1, wherein each of said windings is arranged such that said primary winding is adjacent to said secondary winding, said secondary winding is adjacent to said tertiary winding, and said tertiary winding is adjacent to said fourth winding.

6. A magnetron power supply as recited in claim 1 or claim 5, wherein said windings are spaced apart such that a space between said tertiary winding and said fourth winding is made larger than a space between said secondary winding and said tertiary winding.

7. A magnetron power supply as recited in claim 1 or claim 5, wherein said core of said transformer is provided with a gap near said primary winding.

8. A magnetron power supply as recited in claim 1 or claim 5, wherein said windings are spaced apart such that a space between said primary winding and said secondary winding is made larger than a space between said secondary winding and said tertiary winding.

9. A magnetron power supply as recited in claim 1, wherein a terminal of said secondary winding is at a same potential as said core of said transformer.

10. A magnetron power supply as recited in claim 1, wherein an output of said secondary winding is half-wave rectified, and the thus half-wave rectified signal is supplied to said magnetron.

11. A magnetron power supply as recited in claim 1, wherein said core is provided with a gap and wherein said primary winding is disposed on a bobbin, said gap comprising a space integral with said bobbin of said primary winding.

12. A magnetron power supply as recited in claim 1, wherein said secondary winding comprises a plurality of windings.

13. A magnetron power supply as recited in claim 1, wherein said primary winding comprises a winding of litz wire.

14. A magnetron power supply comprising: a magnetron having a cathode heater;

a rectifying means for converting an ac-power source signal into a dc-power source signal;

a switching means coupled to a driving circuit and said rectifying means for converting said dc-power source signal into a low-voltage high-frequency signal in accordance with said driving circuit; and a transformer having a core, said transformer coupled to said switching means and said driving circuit, for converting said low-voltage high-frequency signal into a high-voltage high-frequency signal for driving said magnetron;

said transformer including a primary winding connected to said switching means, a secondary winding connected to and supplying power to said magnetron, a tertiary winding connected to said cathode heater of said magnetron for providing heating power to said cathode heater, said secondary winding being divided in construction into plural windings each connected in series with the other and each inserted into a respective groove provided on a bobbin, and a terminal at the low voltage side of the divided winding being rendered at a same voltage as that of said core.

* * * * *